(12) United States Patent
Stern et al.

(10) Patent No.: US 6,186,399 B1
(45) Date of Patent: Feb. 13, 2001

(54) SCANNER AND MIRROR WITH SHAPE MEMORY ALLOY HINGES

(75) Inventors: Miklos Stern, Flushing, NY (US); Curtis Ray, Alamo, CA (US)

(73) Assignee: Symbol Technologies, Inc., Holtsville, NY (US)

( * ) Notice: Under 35 U.S.C. 154(b), the term of this patent shall be extended for 0 days.

(21) Appl. No.: 09/152,264

(22) Filed: Sep. 14, 1998

Related U.S. Application Data

(62) Division of application No. 08/483,163, filed on Jun. 7, 1995, now Pat. No. 5,966,230, which is a division of application No. 08/141,342, filed on Oct. 25, 1993, now abandoned.

(51) Int. Cl.$^7$ ........................................... G06K 7/10
(52) U.S. Cl. ................. 235/462.01; 235/462.36
(58) Field of Search ............................ 235/462.36, 462.01

(56) References Cited

U.S. PATENT DOCUMENTS

| | | |
|---|---|---|
| 3,981,566 | 9/1976 | Frank et al. . |
| 4,700,541 * | 10/1987 | Gabriel et al. ........................ 60/528 |
| 4,864,824 | 9/1989 | Gabriel et al. . |
| 4,874,215 * | 10/1989 | Montagu ................. 359/213 |
| 5,061,914 | 10/1991 | Busch et al. . |
| 5,097,354 * | 3/1992 | Goto ..................... 359/212 |
| 5,629,790 | 5/1997 | Neukermans et al. . |
| 6,014,240 | 1/2000 | Floyd et al. ................ 359/201 |

OTHER PUBLICATIONS

A. David Johnson, et al., "Vacuum–Deposited TiNi Shape Memory Film: Characterization and Microdevices", 1991, JOP Publishing Ltd., pp. 34–41.

A. David Johnson, et al, "Fabrication of Silicon–Based Shape Memory Alloy Micro–Actuators", Mat. Res. Soc. Symp. Proc., vol. 276, 1992, pp. 151–160.

Peter Krulevitch, et al., "Thin Film Shape Memory Alloy Microactuators", Journal of Microelectromechanical Systems, vol. 5, No. 4, Dec. 1996, pp. 270–281.

* cited by examiner

*Primary Examiner*—Mark Tremblay
(74) *Attorney, Agent, or Firm*—Finnegan, Henderson, Farabow, Garrett & Dunner, L.L.P.

(57) ABSTRACT

An integrated scanner for scanning a barcode is formed on a common substrate. The scanner may include a micro-machined mirror, a laser diode, and a detector, mounted on a single substrate or several connected substrates. Lenses can be used to focus a laser beam from the laser diode as well as expand a laser beam deflected by the micro-machined mirror. The scanner may also scan a barcode without using a micro-machined mirror by rotating the laser diode.

11 Claims, 8 Drawing Sheets

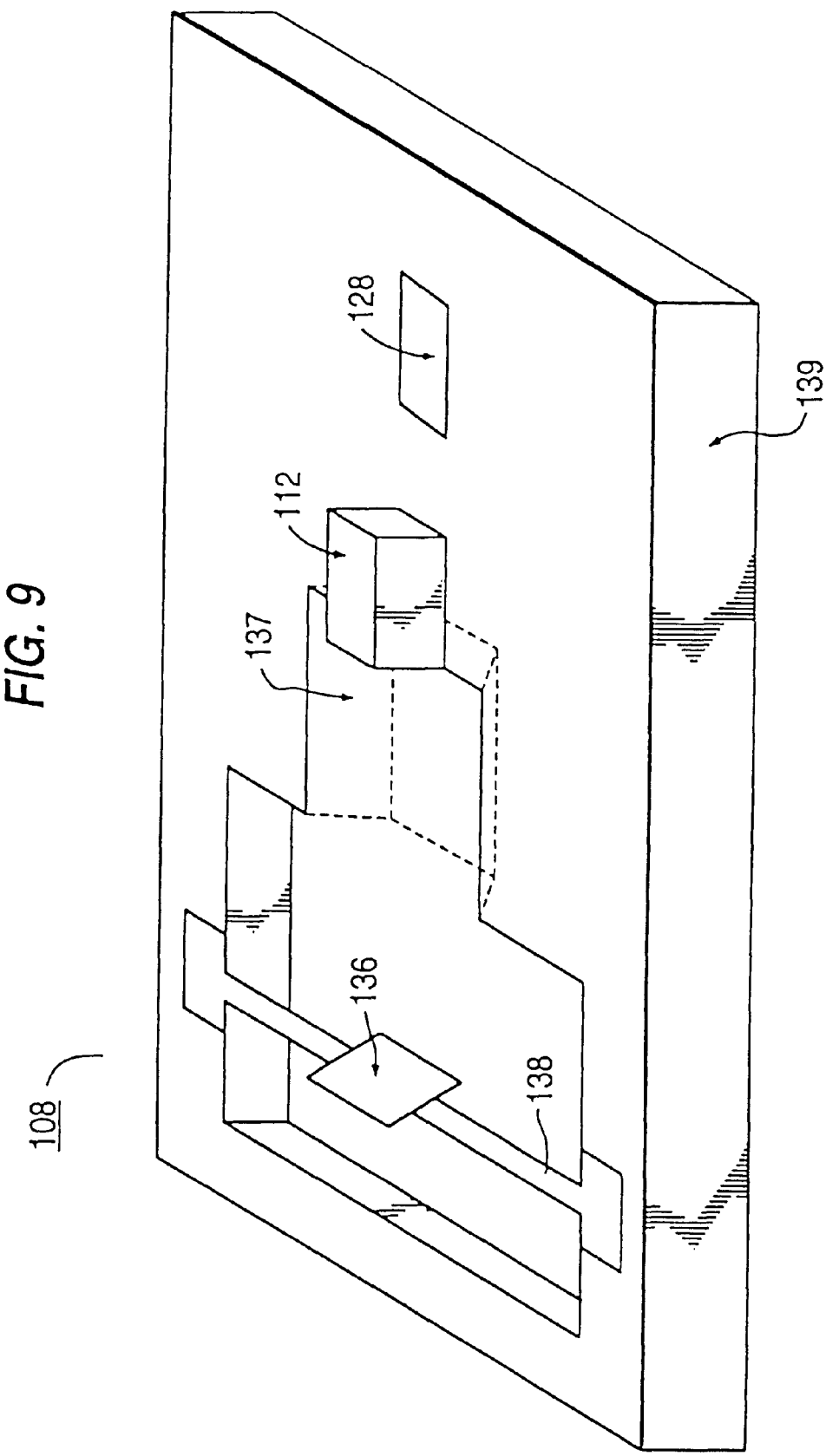

US 6,186,399 B1

SCANNER AND MIRROR WITH SHAPE MEMORY ALLOY HINGES

This is a divisional application of application Ser. No. 08/483,163 filed Jun. 7, 1995, now U.S. Pat. No. 5,966,230 which is a divisional of Ser. No. 08/141,342, filed Oct. 25, 1993, now abandoned.

BACKGROUND OF THE INVENTION

The present invention relates to scanners. More specifically, the present invention relates to integrated barcode scanners mounted on common substrates.

Barcodes store information about an associated object and are read by scanners, which are now handheld. As barcode scanners have become smaller, the number of uses have increased. Today, barcode scanners are used to price store items, control warehouse inventory, and even route overnight packages.

In reading a barcode, a barcode scanner scans a laser beam across the barcode and detects the reflected light from the barcode. Typically, barcode scanners, including handheld scanners, have been constructed using discrete components. These discrete components, such as laser diodes and rotatable scanning mirrors, are separately manufactured and carefully aligned in the scanner to obtain the proper scanning function.

However, the use of discrete components limits further miniaturization of the barcode scanner, thus restricting additional uses for the barcode scanner. Further, improper alignment of the discrete components can render the scanner inoperative. Thus, the discrete components must be carefully aligned during assembly, making the scanner complex and costly to construct.

Accordingly, it is desirable to provide an improved barcode scanner with increased flexibility.

It is also desirable to provide a miniaturized barcode scanner.

It is also desirable to provide a barcode scanner that is simpler to construct.

It is also desirable to decrease the cost of constructing a barcode scanner.

Additional desires of the invention will be set forth in the description which follow, and in part will be apparent from the description, or may be learned by practice of the invention. The advantages of the invention may be realized and obtained by means of the instrumentalities and combinations particularly pointed out in the amended claims.

SUMMARY OF THE INVENTION

To achieve the foregoing desires, a barcode scanner mounted on a common substrate is disclosed. More particularly and in accordance with the purposes of the invention as embodied and broadly described herein, the present invention provides a light scanning system formed on a common substrate comprising a light scanner, integrated on the substrate, for scanning light across a target and a sensor, integrated on the substrate, for detecting light reflected from the target.

The barcode scanner may include a light scanner comprising a micro-machined mirror which may be rotated or bent to scan an incident light beam. The barcode scanner may also scan a light beam without using a micro-machined mirror by rotating a light source.

BRIEF DESCRIPTION OF DRAWINGS

The accompanying drawings, which are incorporated in and constitute a part of this specification, illustrate embodiments of the invention and, together with the description, serve to explain the objects, advantages, and principles of the invention.

In the drawings,

FIG. 9 is perspective view of a scanner according to a fifth embodiment of the present invention;

DETAILED DESCRIPTION

The present invention is directed to a light scanning system formed on a common substrate. The light scanning system may include a light source for producing a light beam, a deflector for deflecting the focused light beam in a desired pattern, a lens, a detector for monitoring the light beam from the light source, a sensor for detecting a reflection of the deflected light beam, and electronic circuits.

Reference will now be made in detail to preferred embodiments of the invention, examples of which are illustrated in the accompanying drawings.

Figure 1:
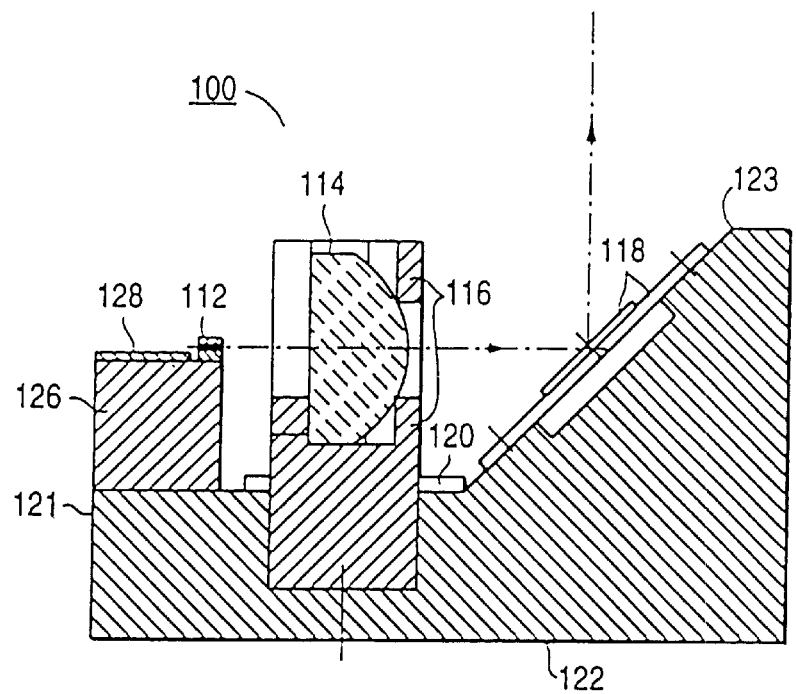
FIG. 1 is a side view of a scanner according to a first embodiment of the present invention.

A first embodiment of the scanner of the present invention is shown in FIG. 1 and is designated generally by reference numeral 100. Scanner 100 includes a laser diode 112, spherical lens 114, scan module 118, and detectors 120 and 128. Laser diode 112 and detector 128 are mounted on a laser submount 126 which serves as a supporting stand. Spherical microlens 114 is supported by lens holder 116. Laser submount 126, lens holder 116, scan module 118, and detector 120 are mounted on a substrate 122.

The surface of substrate 122 includes a flat portion 121 adjacent to a sloped portion 123. Laser submount 126 and lens holder 116 are mounted on flat portion 121. Scan module is mounted on sloped portion 123. In a preferred embodiment, substrate 122 is made of a semiconductor material such as silicon, and the sloped portion 123 is inclined at about a 45° angle.

Laser diode 112 is aligned with an optical axis of lens 114 and emits a visible laser beam according to a laser diode driver, not shown in the drawings. In a preferred embodiment, laser diode 112 can be any commercially available laser diode which is capable of producing a laser beam suitable for bar code scanning, such as the laser diode chip from a Sony SLD 1101 VS.

Detector 128 is mounted on laser submount 126 behind laser diode 112 for monitoring the output of laser diode 112. Detector 128 creates a signal representative of the amount of light output from the back of laser diode 112, which is proportional to the intensity of the laser beam output from the front of laser diode 112. That signal can be transmitted to a laser diode driver to control the output of laser diode 112.

FIG. 1 shows lens 114 secured in an upright position by a separate lens holder 116. It is understood that lens 114 and lens holder 116 could also be a single integrated device. Although FIG. 1 shows lens holder 116 mounted on the flat portion of substrate 122, it could also be attached to laser submount 126. Also, although lens 114 is shown as a spherical microlens in the preferred embodiment, lens 114 could also comprise any other lens for focusing a laser beam, such as a ball microlens, a grated rod index lens (GRIN), a micro-FRESNEL lens, or a cylindrical microlens.

The desired focus of the laser beam can be achieved by adjusting the distance between lens 114 and laser diode 112. Although lens holder 116 may be adjustable to move lens 114 closer to or farther from laser diode 112, it is preferred that lens 114 be fixed in a pre-aligned position.

Scan module 118 is mounted on the sloped portion 123 to permit scan module 118 to intercept and deflect a laser beam from laser diode 112. During operation of scanner 100, scan module 118 scans the laser beam in one dimension across a target.

Scan module 118 preferably comprises a micro-machined mirror, which is fabricated using existing VLSI technology. K. E. Peterson, "Silicon as a Mechanical Material," Proc. of IEEE, Vol. 70, No. 5, 420–457 (May 1982), U. Breng et al., "Electrostatic Micromechanic Actuators," 2 J. Micromech. Microeng. 256–261 (1992), and Larry J. Hornbeck, "Deformable-Mirror Spatial Light Modulators," 1150 Proceedings of SPIE (1989) describe acceptable techniques for fabricating micro-machined mirrors.

Detector 120, which is preferably mounted on the flat portion 121 of substrate 122, detects a reflection of a laser beam as the beam is scanned across a target. The laser beam scatters as it is scanned across the target, thus allowing detector 120 to receive and detect light reflected from the target. Detector 120 then creates a signal representing the detected reflection. For example, where a laser beam has been scanned across a barcode having light and dark regions, the light regions of a barcode will reflect light, while the dark regions will not. As the laser beam is scanned across the barcode, detector 120 detects the dispersed light, which represents the light regions of the barcode, and creates a corresponding signal, thus permitting the barcode to be "read." In a preferred embodiment, detector 120 is a monolithically integrated photodetector.

Figure 2:
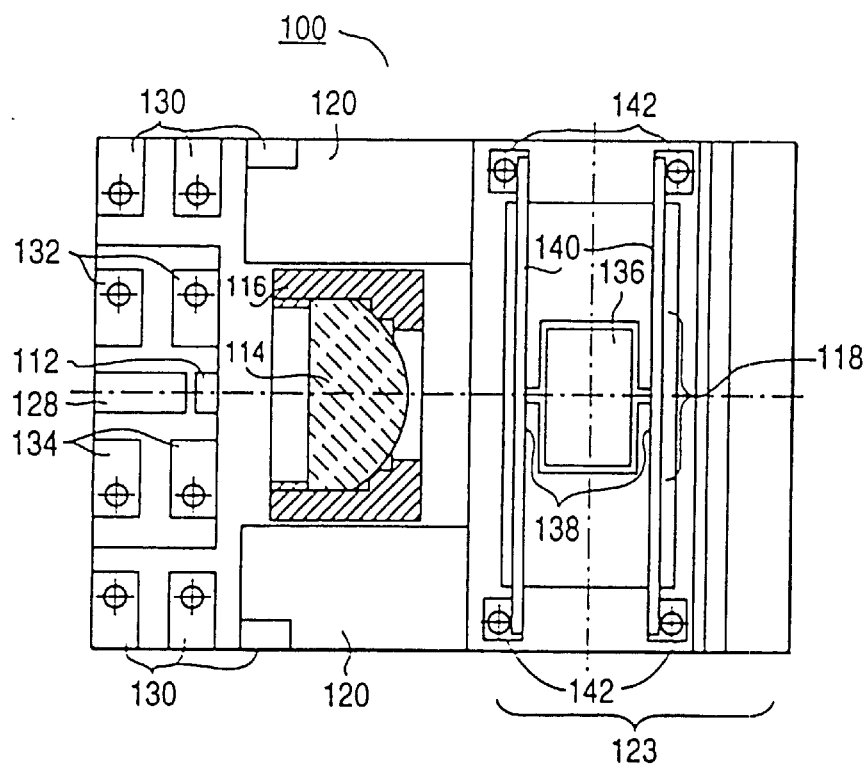
FIG. 2 is a plan view of a scanner according to the first embodiment of the present invention.

FIG. 2 shows a top view of scanner 100. Laser diode 112, lens 114, and scan module 118 are arranged in alignment with each other to permit scan module 118 to deflect a focused laser beam. Detector 120 can be located on either side of lens holder 116.

Wire bond pads 130 permit detector 120 to interface with an external device, for example, a signal processor. Wire bond pads 132 and 134 permit laser diode 112 and detector 128, respectively, to interface with an external device, such as a laser diode driver for controlling the output of laser diode 112. Wire bond pads 142 allow micro-machined mirror to be actuated by an external device such as a feedback circuit (not shown).

Scan module 118 of the present invention may be implemented using various structures such as torsional or cantilever as described in detail below. Further, scan module 118 can be actuated by various techniques also described in detail below such as electrostatic actuation and heat actuation. Under heat actuation, for example, hinges are made of shape memory alloy or are bimetallic.

Under a torsional structure, scan module 118 includes scanning mirror 136, torsional hinges 138, and frame 140. Hinges 138 are supported by frame 140, which is mounted on the sloped portion 123 of substrate 122. Scanning mirror 136 is suspended by hinges 138 and rotates about an axis formed by hinges 138 along the surface of the sloped portion of substrate 122. Scanning mirror 136 can be rotated up to 90°. As described above, wire bond pads 142 permit scan module 118 to interface with an external device, such as a scan module driver for controlling scan module 118.

Figure 3:
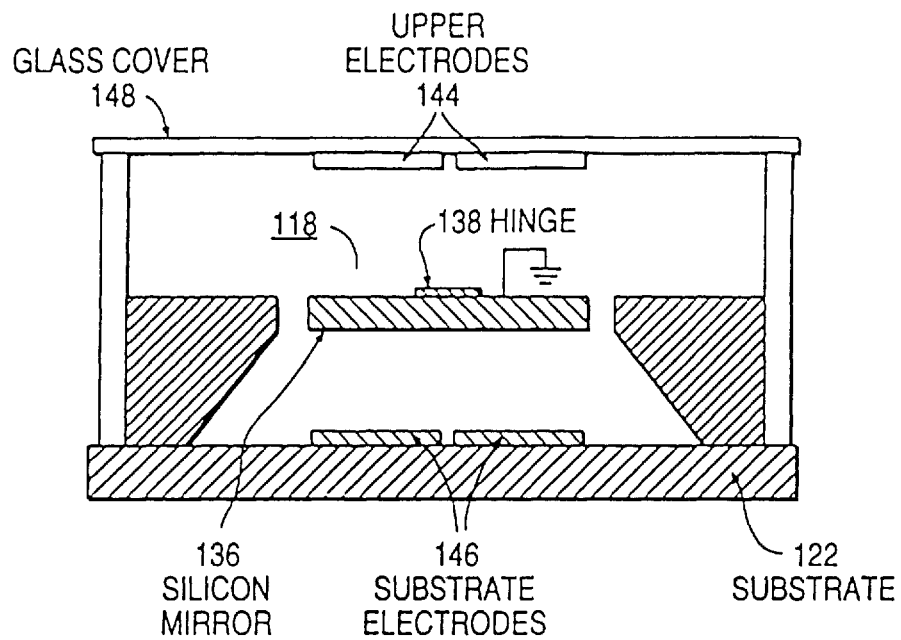
FIG. 3 is a side view of a scan module used in the scanner shown in FIG. 1.

FIG. 3 shows various elements for controlling scan module 118. Electrostatic actuation is one way that scan module 118 can rotate mirror 136 to scan an incident laser beam. Accordingly, in the preferred embodiment, scan module 118 includes upper electrodes 144 mounted on a glass cover 148 on either side of the rotation axis above mirror 136, and substrate electrodes 146 mounted on substrate 122 on either side of the rotation axis below mirror 136. Upper electrodes 144 need to be transparent to allow light to enter and exit scan module 118. For example, upper electrodes 144 can be formed by depositing on glass cover 148 a semi-transparent metallic coating having a low reflectivity.

During operation of scan module 118, upper electrodes 144 and substrate electrodes 146 are energized to create an electrostatic force to rotate mirror 136. The electrostatic force creates a voltage between one of the substrate electrodes 146 and mirror 136, which in turn creates charges of opposite polarity between substrate electrode 146 and mirror 136. The resulting attractive force pulls the closer side of mirror 136 downward, thus rotating mirror 136 along the rotation axis.

At the same time, a voltage is applied between mirror 136 and a corresponding upper electrode 144 to aid the substrate electrode 146 in rotating mirror 136. The resulting attractive force pulls the other side of mirror 136 upward, continuing to rotate mirror 136 in coordination with the substrate electrode 146.

Mirror 136 can be rotated in the opposite direction by applying voltages to the other substrate electrode 146 and upper electrode 144. An incident light beam can be scanned by scan module 118 by alternately applying voltages to the appropriate substrate electrodes 146 and upper electrodes 144. This approach provides a simple method of actuating scan module 118 using very low power consumption.

Although FIG. 3 shows both upper electrodes 144 and substrate electrodes 146, mirror 136 could also be rotated using only one set of electrodes, i.e. either upper electrodes 144 or substrate electrodes 146. In such a configuration, substrate electrodes 146 could rotate mirror 136 without using upper electrodes 144 by alternately applying voltages between the substrate electrodes 146 and mirror 136. Upper electrodes 144 could work alone in the same manner. Either situation would require a greater attractive force to rotate mirror 136.

While hinges 138 can be made of any suitable material, hinges 138 are preferably made of a shape memory alloy, such as titanium-nickel, because of the unique shape-restoring features of such alloys. Shape memory alloys return to their original shape when heated above a transition temperature. After hinges 138 are twisted by the rotation of mirror 136, they can be subjected to a short electric pulse prior to each scan to heat them and return mirror 136 to its original position. In a preferred embodiment, a 10–20 mW pulse can be applied for 10 milliseconds or less to restore mirror 136 to its original position.

Additional embodiments of the invention will now be described where like or similar parts are identified throughout the drawings by the same reference characters.

Figure 4:
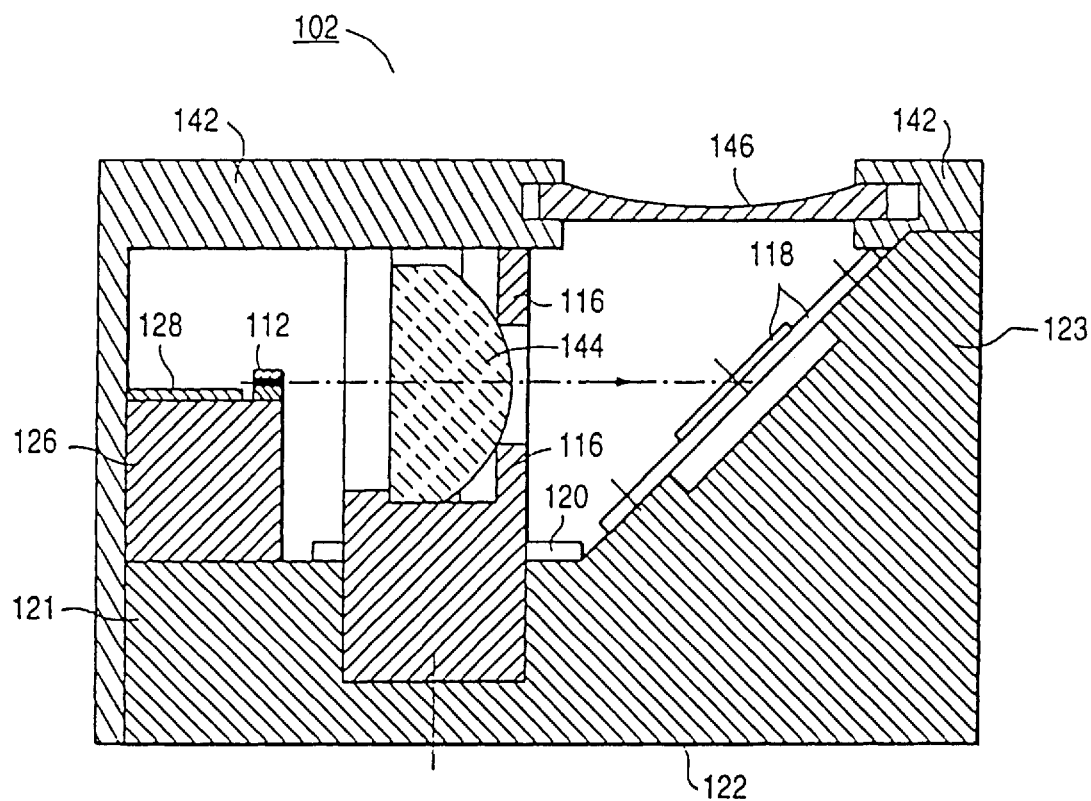
FIG. 4 is a side view of a scanner according to a second embodiment of the present invention.

FIG. 4 shows a second embodiment of a scanner of the present invention. Scanner 102 includes laser diode 112 mounted on laser submount 126 in alignment with an optical axis of lens 144 for emitting a laser beam, and detector 128 mounted on laser submount 126 for monitoring the output of laser diode 112. Lens 144, supported by lens holder 116, focuses the laser beam emitted from laser diode 112. Laser submount 126 and lens holder 116 are mounted on a flat portion 121 of substrate 122. Scan module 118, mounted on a sloped portion 123 of substrate 122, deflects the focused light beam across a target, and detector 120 detects a reflection of the scanned laser beam.

In addition, scanner 102 further includes lens 146, supported by lens holder 142, for magnifying the deflection of the beam from scan module 118 before the beam is scanned across a target. A wider deflection of the beam allows a smaller mechanical deflection angle of a micromirror in module 118, and increases the flexibility in focusing the beam. As shown in FIG. 4, lens 144 is a positive lens and lens 146 is a negative lens, though it is understood that lens 144 and lens 146 can be of any type.

Figure 5:
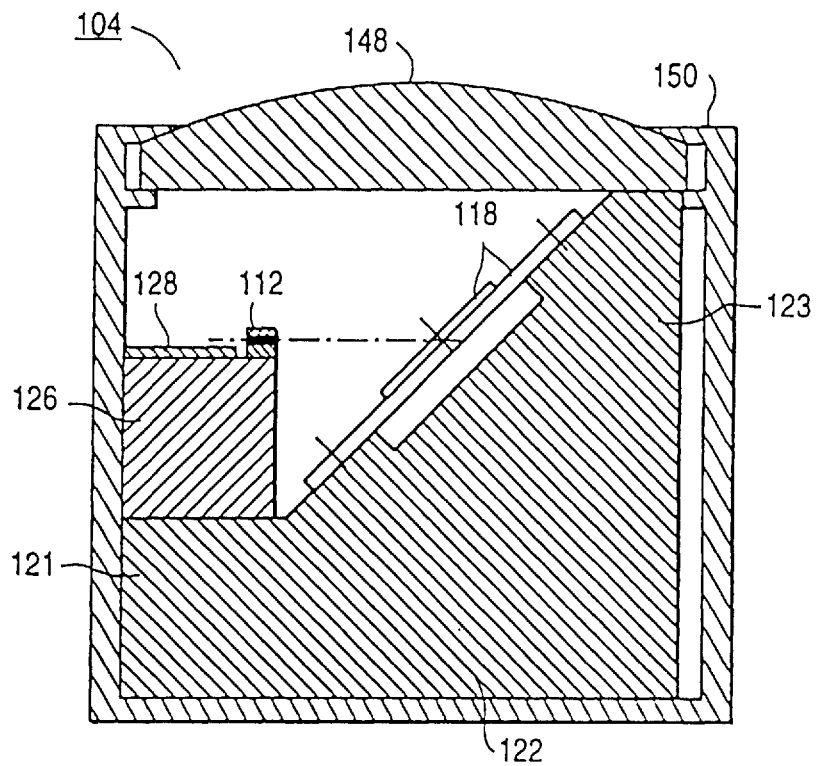
FIG. 5 is a side view of a scanner according to a third embodiment of the present invention.

FIG. 5 shows a third embodiment of the invention as scanner 104 comprising laser diode 112 mounted on laser submount 126, which is in turn mounted on flat portion 121 of substrate 122. Detector 128 is also mounted on laser submount 126 behind laser diode 112 for monitoring the output of laser diode 112. Scan module 118, mounted on the sloped portion 123 of substrate 122, receives an unfocused laser beam from laser diode 112 and deflects that beam through lens 148, which is supported by lens holder 150. Lens 148 focuses the deflected beam before it reaches a target, such as a barcode. The configuration of scanner 104 provides a simple and compact structure due to the absence of a lens between laser diode 112 and scan module 118.

Figure 6:
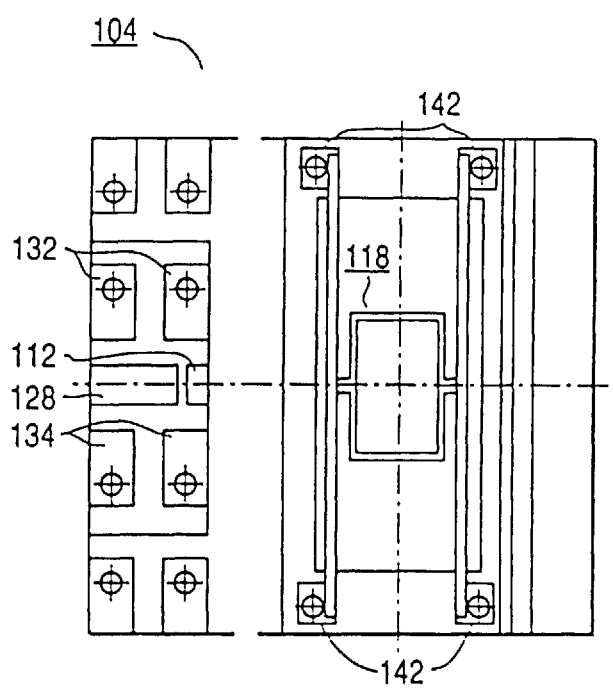
FIG. 6 is a plan view of a scanner according to the third embodiment of the present invention.

FIG. 6 shows a top view of scanner 104 without lens 148. Laser diode 112 is aligned with scan module 118. Wire bond pads 132 and 134 allow external devices to interface with laser diode 112 and detector 128, respectively. Wire bond pads 142 allow external devices to interface with the micro-machined mirror. Although FIG. 6 shows no detector for detecting the reflected light, such a detector may easily be mounted near scan module 118 or at some other desirable location.

Figure 7A:
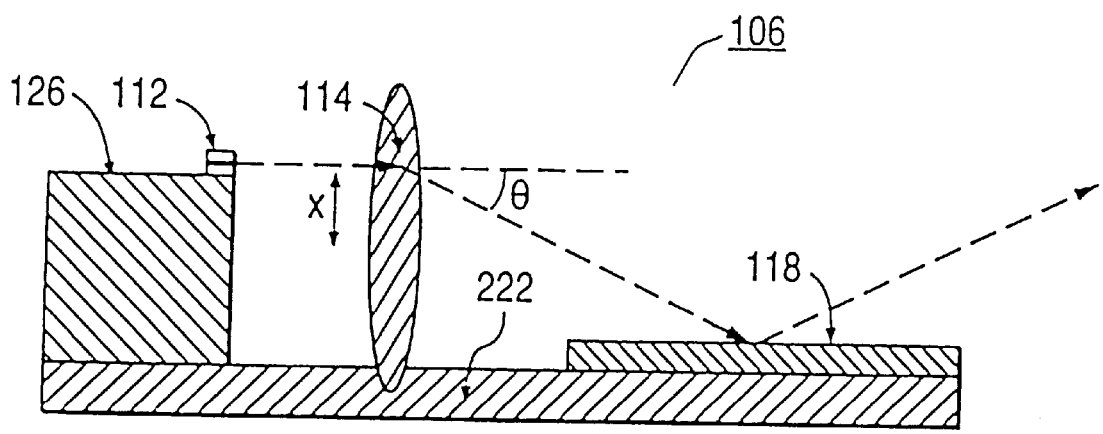
FIGS. 7A and 7B show a side view of scanners according to a fourth embodiment of the present invention.
Figure 7B:
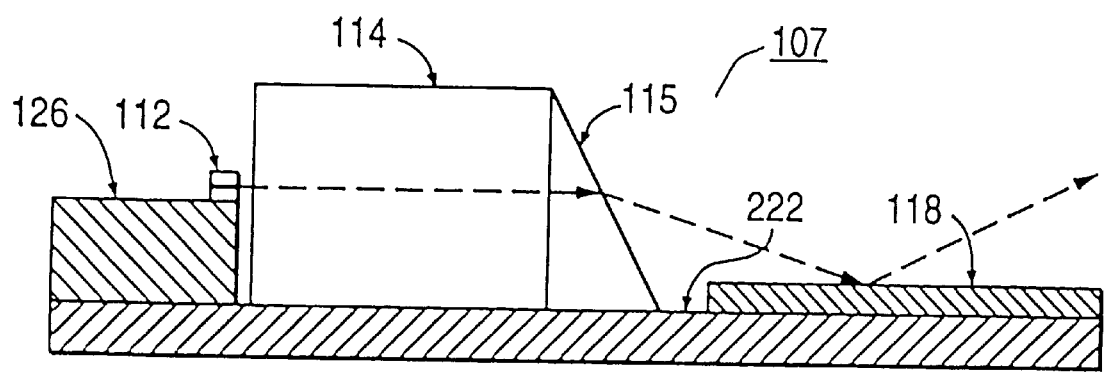

A fourth embodiment of the present invention bends the light beam onto a scan module and is shown in FIGS. 7A and 7B. As shown in FIGS. 7A and 7B, respectively, scanners 106 and 107 comprise laser diode 112, lens 114, scan module 118. Lens 114 used in scanners 106 and 107 can be of any type and is mounted on substrate 222, which is completely flat. Laser diode 112 is mounted on laser submount 126.

As shown in FIG. 7A, laser diode 112 of scanner 106 is aligned above an optical axis of lens 114 by an amount x. By aligning laser diode 112 in this way, the laser beam emitted from laser diode 112 is bent downward an angle θ. The bent laser beam strikes scan module 118, which is mounted on flat substrate 222. Scan module 118 scans the laser beam across a target in the manner described in the other embodiments.

As shown in FIG. 7B, scanner 107 also includes a prism 115 positioned adjacent to lens 114. A laser beam emitted from laser diode 112 passes through lens 114 and is bent downward by prism 115 onto scan module 118. Again, scan module 118 scans the laser beam across a target in the manner described in the other embodiments.

Bending the laser beam emitted from laser diode 112 eliminates the need for a sloped substrate. This provides a distinct advantage because a flat substrate is easier to manufacture than a sloped substrate.

Figure 8:
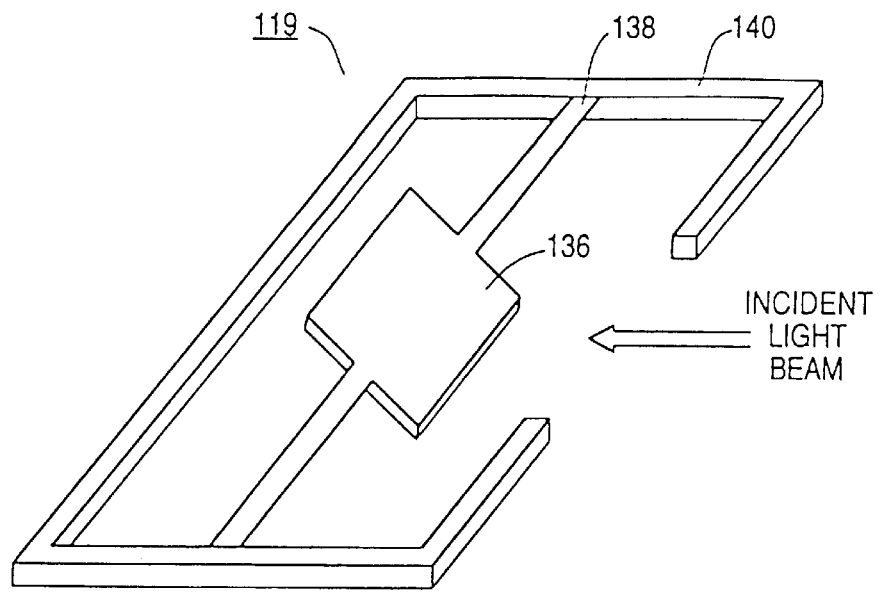
FIG. 8 is a perspective view of another scan module according to the present invention.

FIG. 8 shows another scan module according to the present invention designated by numeral 119. Mirror 136, suspended by hinges 138, rotates along an axis of rotation perpendicular to an incident laser beam. Hinges 138 are supported by frame 140. Mirror 136 is tilted at an angle with respect to the surface of substrate 222 to intercept and deflect an incident light beam perpendicular to the surface of substrate 222. Mirror 136 is rotated back and forth, for example, using electrostatic actuation as described above, causing an incident laser beam to be scanned across a target such as a barcode.

FIG. 9 shows a fifth embodiment of a scanner of the present invention. Scanner 108 implements scan module 119 shown in FIG. 8. In scanner 108, laser diode 112, mounted on flat substrate 139, emits a laser beam parallel to the surface of substrate 139 onto mirror 136. Detector 128 monitors the output of laser diode 112. Hinges 138, also mounted on flat substrate 139, allow mirror 136 to rotate and deflect the beam in a desired pattern. A groove 137 is etched in substrate 139 in front of laser diode 112 to hold a lens (not shown) to focus the laser beam emitted from laser diode 112.

Scanner 108 of FIG. 9 is more planar than scanner 100 of FIG. 1 since the components, including scan module 119, can be mounted on a single, low-profile, flat substrate 139. Not only is the flat substrate 139 of scanner 108 easier to manufacture than the sloped substrate 123 of scanner 100, the low profile of scanner 108 requires less space than scanner 100, thus allowing it to be used in more applications.

Figure 10A:
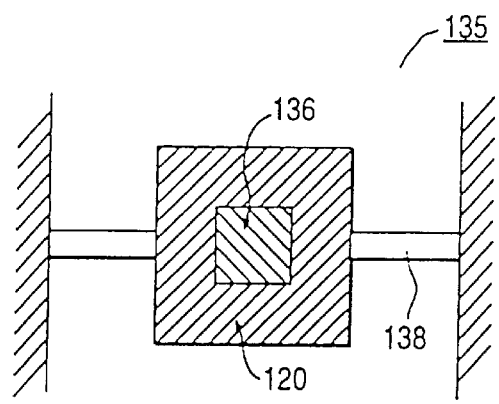
FIGS. 10A–10B are a top and side view, respectively, of a retro-collective micro-machined mirror according to the present invention.
Figure 10B:
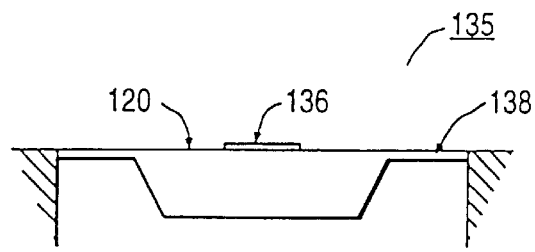

FIGS. 10A and 10B show a top and side view, respectively, of a retro-collective micro-machined mirror 135. Retro-collective micro-machined mirror 135 can be implemented in place of scan module 118 or 119 in any of the embodiments of the present invention. Mirror 136 is mounted in the center of detector 120, which is suspended by hinges 138. Mirror 136 and detector 120 are rotated along hinges 138 by electrostatic actuation as described above, causing a laser beam incident to mirror 136 to scan a target. Detector 120 detects a reflection of the scanned beam from the target.

Retro-collective micro-machined mirror 135 minimizes the amount of space required in a scanner by eliminating the need for a separate detector and scan mirror. Further, detector 120 in the retro-collective micro-machined mirror 135 detects reflected light more effectively than a stationary detector because detector 120 is always rotated to face the scanned target, thus allowing detector 120 to receive more dispersed light reflected from the target. This also reduces noise (i.e. light not reflected from the target) detected by detector 120.

Figure 11:
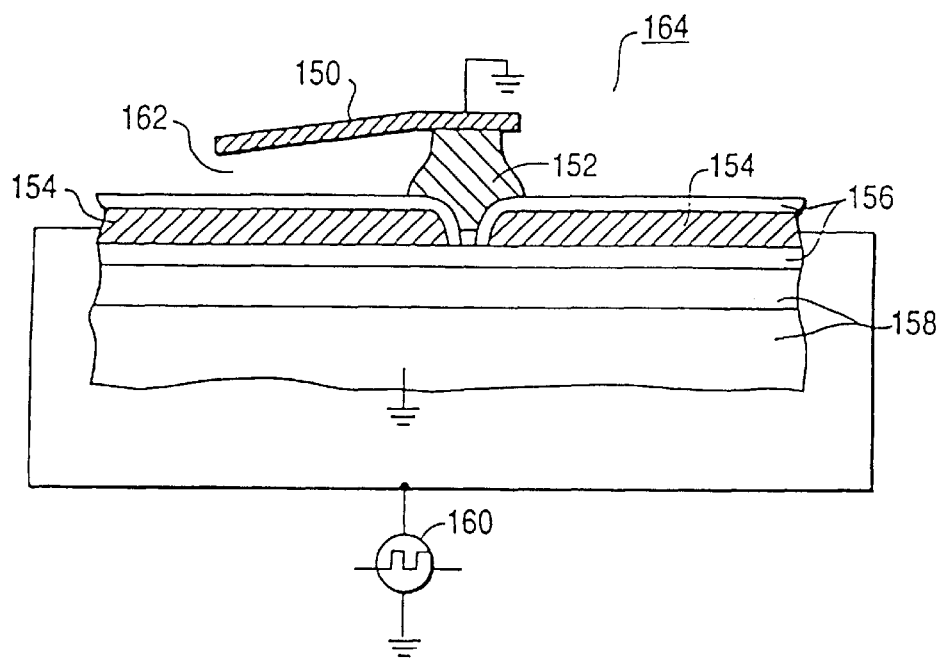
FIG. 11 is a side view of a scan module according to the present invention using deformable mirrors.

FIG. 11 shows a scan module 164 with a cantilever structure that uses deformable mirrors rather than a rotating mirror. Scan module 164 includes mirror element 150, support 152, silicon electrodes 154, oxide film 156, silicon substrate 158, and voltage source 160.

Mirror element 150 is made of a reflective material, such as aluminum, and is electrically grounded and secured at one end to support 152. Support 152 is mounted on electrode 154, which is coated with oxide film 156 for electrical insulation. Electrode 154 is mounted on substrate 158 and is connected to voltage source 160. Electrode 154 is separated from mirror element 150 by air gap 162.

When voltage source 160 applies a voltage to an electrode 154, it creates an electrostatic field within air gap 162, causing an electrostatic attraction between electrode 154 and corresponding mirror element 150. The electrostatic attraction forces mirror element 150 to bend downward and deflect an incident light beam. Proper control of the electrostatic would scan an incident light beam.

Figure 12A:
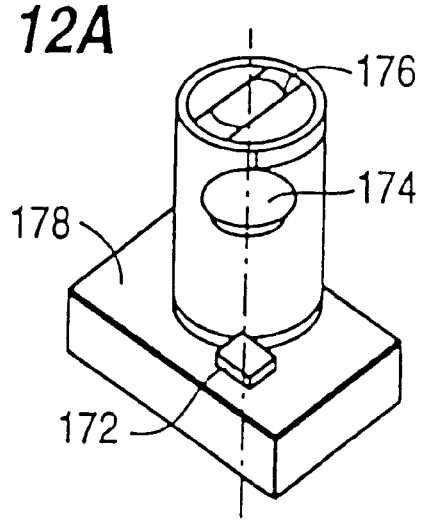
FIGS. 12A–12C are a perspective, side, and top view, respectively, of a scanner according to a sixth embodiment of the present invention.
Figure 12B:
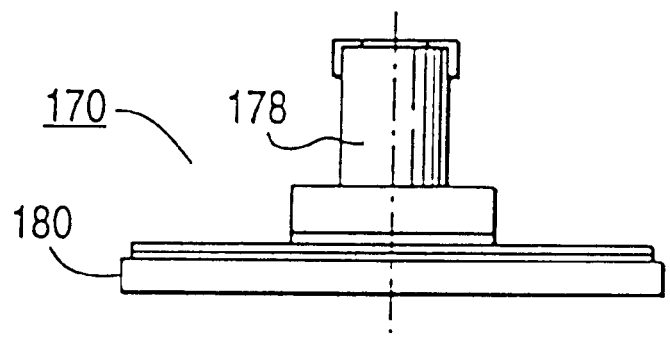
Figure 12C:
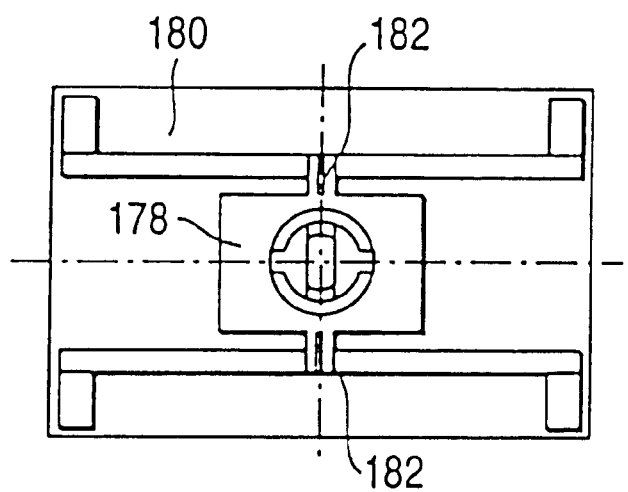

The present invention can also be implemented without using mirrors. FIGS. 12A–12C show a perspective, side, and top view, respectively, of a sixth embodiment of the present invention. Scanner 170 includes focusing module 178 rotatably mounted on scan module 180. Focusing module 178 comprises laser diode 172, lens 174, and aperture 176, and is suspended by hinges 182 the same way mirror 136 is suspended by hinges 138 in scan module 118 (see FIG. 3), and focusing module 178 can be rotated back and forth along hinges 182 the same way mirror 136 is rotated along hinges 138 by scan module 118.

A laser beam emitted from laser diode 172 passes through lens 174 and aperture 176 to focus the beam. Rotating focusing module 178 thus scans an incident laser beam across a target, such as a barcode, without using a mirror.

Figure 13:
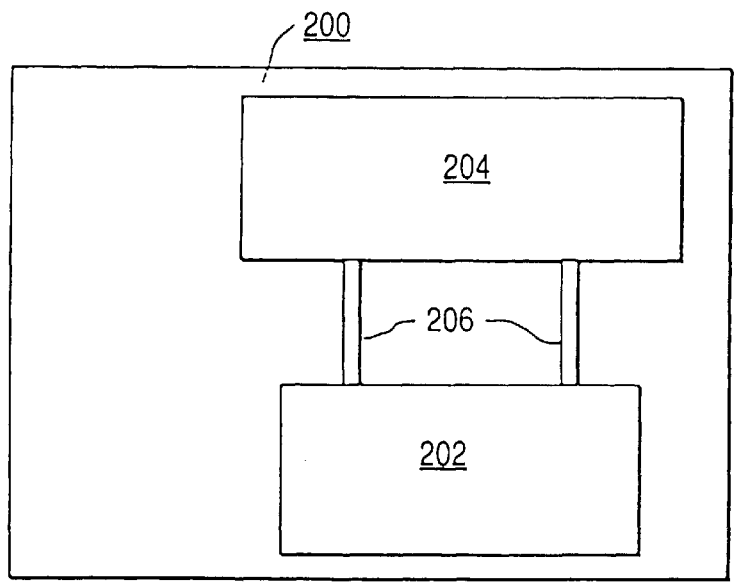
FIG. 13 shows a scanner system incorporating the scanner according to the present invention.

FIG. 13 shows a scanner system 200 incorporating scanner 202, which represents the various embodiments of the present invention. External devices 204 are connected to scanner 202 by lines 206. Scanner system 200 may be, for example, a stationary barcode scanner or a handheld barcode scanner.

The scanners of the present invention can be manufactured using either monolithic integration or hybrid integration. Monolithic integration fabricates the opto-mechanical system entirely on a single semiconductor chip. On the other hand, a hybrid integrated circuit combines one or more individually-fabricated subsystems on a common substrate. Hybrid integration generally involves less complicated processes than monolithic integration and permits the combination of more accurate devices.

Many of the components of the present invention including the laser diode, detectors, lenses, and scan module could be fabricated using VLSI technology. If monolithic integration is used, all of these components are fabricated onto a single chip in a single series of process steps. If hybrid integration is used, each component is individually fabricated and mounted onto a common substrate.

However, it is not necessary that all of the components be VLSI. For example, the lens for focusing the light beam could be constructed using other known techniques and then appropriately mounted onto the scanner.

It will be apparent to those skilled in the art that various modifications and variations can be made in the scanner of the present invention without departing from the spirit or scope of the invention. Thus, it is intended that the present invention cover the modifications and variations of this invention provided they come within the scope of the appended claims and their equivalents.

What is claimed is:

1. A bar code reader comprising:
    a substrate including a flat surface portion and a recessed area disposed within the flat portion;
    a light source;
    a detector; and
    a scanner module mounted to said substate, said scanner comprising:
        an oscillatable scanner element;
        a mounting frame, the scanner element being mounted for torsional oscillation with respect to the mounting frame by first and second hinges extending between the scanner element and the mounting frame, said mounting frame being attached to said flat surface portion of the substate such that said oscillatable scanner element is suspended directly above said recessed area; and
        conductive pads on the frame for permitting electrical connection between the module and the substrate.

2. A bar code reader as defined in claim 1, wherein the mounting frame is a flat, generally elongated rectangularly shaped element, and the scanner is a planar reflector centrally suspended in the plane of the frame.

3. A bar code reader as defined in claim 1, wherein the frame further comprises a glass cover mounted generally parallel to the scanner element and allowing light to enter and exit the module.

4. A bar code reader as defined in claim 1, wherein said hinges are composed of a shape memory alloy so that when heated above a transition temperature, said hinges return to their original shape.

5. A bar code reader as defined in claim 1, wherein the shape memory alloy is titanium nickel.

6. A bar code scanning subassembly comprising:
    a substrate including a flat surface portion and a recessed area disposed within the flat portion;
    a light source for generating a light beam;
    a scanner module having conductive pads and including a reflector for reflecting the light beam in a scanning pattern, said scanner module being mounted on the flat surface portion of said substrate such that said reflector is suspended directly above the recessed area; and
    a drive for supplying an electrical signal to said scanner module to cause said reflector to move to produce a scanning pattern.

7. A subassembly as defined in claim 6, wherein the scanner module is individually fabricated and includes
    a mounting frame, the reflector being mounted for torsional oscillation with respect to the mounting frame by at least first and second hinges extending between the scanner element and the mounting bracket.

8. A subassembly as defined in claim 6, wherein the laser diode is mounted on the substrate such that the path of the light beam is directed from the laser diode to the scanner module and intersects the reflector at an angle for reflection therefrom.

9. A subassembly as defined in claim 7 wherein the mounting frame is a flat, generally elongated rectangularly shaped element, and the reflector is a planar mirror centrally suspended in the plane of the frame.

10. A subassembly as defined in claim 7, wherein said hinges are composed of a shape memory alloy so that when heated above a transition temperature, said hinges return to their original shape.

11. A subassembly as defined in claim 8 further comprising an individually fabricated housing lens assembly mounted on the substrate in the path of the light beam.

* * * * *